United States Patent
Cho et al.

(10) Patent No.: US 8,674,427 B2
(45) Date of Patent: Mar. 18, 2014

(54) NONVOLATILE MEMORY DEVICE AND METHOD OF MANUFACTURING THEREOF

(75) Inventors: Jeong-ho Cho, Cheongju-si (KR); Jung-goo Park, Cheongju-si (KR); Min-wan Chu, Cheongju-si (KR); Doo-yeol Ryu, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 13/469,238

(22) Filed: May 11, 2012

(65) Prior Publication Data
US 2013/0099301 A1    Apr. 25, 2013

(30) Foreign Application Priority Data
Oct. 19, 2011 (KR) .................. 10-2011-0107228

(51) Int. Cl.
*H01L 29/788* (2006.01)

(52) U.S. Cl.
USPC .. 257/316; 257/324; 257/E21.19; 257/E29.3; 438/593

(58) Field of Classification Search
USPC ............... 257/E29.3, 316, E21.422, E29.309, 257/324, E21.409, E21.423; 438/591
See application file for complete search history.

(56) References Cited

U.S. PATENT DOCUMENTS

| 5,946,240 | A | * | 8/1999 | Hisamune ................ 365/185.28 |
| 6,451,652 | B1 | | 9/2002 | Caywood et al. |
| 7,425,482 | B2 | | 9/2008 | Jeong |
| 8,093,631 | B2 | | 1/2012 | Jeong |
| 2004/0104425 | A1 | * | 6/2004 | Kobayashi et al. ........... 257/321 |
| 2010/0078706 | A1 | * | 4/2010 | Matsuda ....................... 257/326 |
| 2010/0270605 | A1 | * | 10/2010 | Choi et al. ................... 257/316 |

OTHER PUBLICATIONS

Lee, Junghwan et al. "Fabrication and Characterization of a New EEPROM Cell with Spacer Select Transistor." IEEE Electron Device Letters. vol. 26, No. 8, Aug. 2005, pp. 569-571.

* cited by examiner

*Primary Examiner* — Zandra Smith
*Assistant Examiner* — Paul Patton
(74) *Attorney, Agent, or Firm* — NSIP Law

(57) ABSTRACT

A nonvolatile memory device and a method of manufacturing thereof are provided. The method includes forming a floating gate on a substrate, forming a dielectric layer to conform to a shape of the floating gate, forming a conductive layer to form a control gate on the substrate, the control gate covering the floating gate and the dielectric layer, forming a photoresist pattern on one side of the conductive layer, forming the control gate in the form of a spacer to surround sides of the floating gate, the forming of the control gate including performing an etch-back on the conductive layer until a portion of the dielectric layer on the floating gate is exposed, and forming a poly pad, to which a plurality of contact plugs are connected, on one side of the control gate, the forming of the poly pad including removing the photoresist pattern.

23 Claims, 15 Drawing Sheets

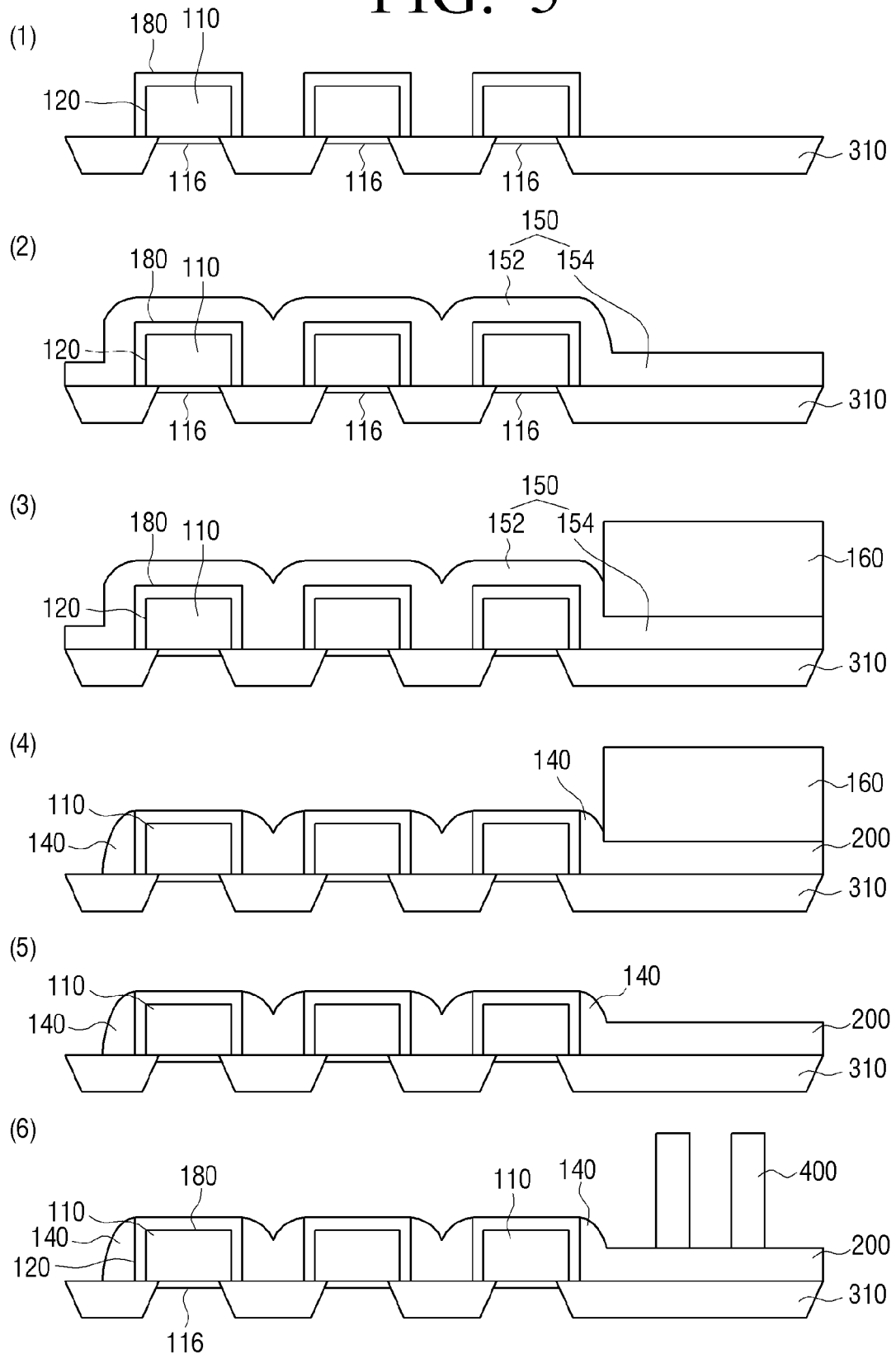

NONVOLATILE MEMORY DEVICE AND METHOD OF MANUFACTURING THEREOF

CROSS-REFERENCE TO RELATED APPLICATIONS

This application claims the benefit under 35 U.S.C. §119 (a) of Korean Patent Application No. 10-2011-0107228 filed on Oct. 19, 2011, in the Korean Intellectual Property Office, the entire disclosure of which is incorporated herein by reference for all purposes.

BACKGROUND

1. Field

The following description relates to a method of manufacturing a nonvolatile memory device.

2. Description of the Related Art

Nonvolatile memory devices, particularly flash memory devices, are largely classified as Erasable Programmable Read-Only Memory (EPROM) Tunnel Oxide (ETOX) flash memory devices or split gate flash memory devices. ETOX flash memory devices have smaller memory cells than split gate flash memory devices. However, since ETOX flash memory devices require the implantation of carriers at a high temperature when programmed, a program current for ETOX flash memory devices is relatively high, and ETOX flash memory devices are susceptible to frequent program and read errors. In addition, ETOX flash memory devices are not free from over-erase issues.

While split gate flash memory devices have relatively large memory cells, they also have excellent properties. Thus, split gate flash memory devices have been widely used in the field of semiconductor devices. Split gate flash memory devices can eliminate the over-erase problem experienced with ETOX flash memory devices because each unit cell thereof is equipped with a selection transistor that maintains a predetermined threshold voltage that can be detected from the outside even when the cell transistor is depleted.

Various techniques have been employed to manufacture a split gate nonvolatile memory device. Split gate nonvolatile memory devices have been developed to address the over-erase problem associated with typical ETOX nonvolatile memory devices. However, the channel length of selection transistors in a split gate nonvolatile memory device is determined by a photolithography and, thus, may often become irregular due to the limits in the alignment capability of lithography equipment.

To address this problem, a method of fabricating a nonvolatile memory device has been developed that can facilitate the formation of control gate poly spacers and prevent the occurrence of a shadow effect during an ion implantation by using an etch-back, instead of photolithography, to form a cell control gate pattern. This method involves forming a control gate in the form of a spacer by performing an etch-back using the height of a floating gate. However, according to this method, while the control gate can be uniform on the sides of the floating gate, a bias cannot be applied to the control gate.

SUMMARY

In one general aspect, there is provided a method of manufacturing a nonvolatile memory device, the method including forming a floating gate on a substrate, forming a dielectric layer to conform to a shape of the floating gate, forming a conductive layer to form a control gate on the substrate, the control gate covering the floating gate and the dielectric layer, forming a photoresist pattern on one side of the conductive layer, forming the control gate in the form of a spacer to surround sides of the floating gate, the forming of the control gate including performing an etch-back on the conductive layer until a portion of the dielectric layer on the floating gate is exposed, and forming a poly pad, to which a plurality of contact plugs are connected, on one side of the control gate, the forming of the poly pad including removing the photoresist pattern.

The general aspect of the method may further provide that the control gate and the poly pad are connected to each other.

The general aspect of the method may further provide that the poly pad is located at an end of an inclined portion of the control gate.

The general aspect of the method may further provide that the poly pad includes a polysilicon peak that is formed over an inclined portion of the control gate.

In another aspect, there is provided a nonvolatile memory device, including a floating gate on a substrate, a control gate having the form of a spacer, the control gate surrounding sides of the floating gate, and a poly pad on one side of the control gate, a plurality of contact plugs being connected to the poly pad.

The general aspect of the device may further provide a polysilicon peak between the control gate and the poly pad.

The general aspect of the device may further provide that the control gate is connected to the floating gate and surrounds the floating gate.

The general aspect of the device may further provide a silicide layer on the control gate, the silicide layer being configured to reduce a resistance of the control gate.

The general aspect of the device may further provide a gate insulating layer on the substrate, the control gate being on the gate insulating layer.

The general aspect of the device may further provide a tunnel insulating layer at a center of the gate insulating layer, the tunnel insulation layer having a thickness that is less than a thickness of the gate insulating layer.

The general aspect of the device may further provide a hard mask on the floating gate. The general aspect of the device may further provide that a height of the control gate is less than or equal to a height of the hard mask and the floating gate combined, and the height of the control gate is greater than a height of the floating gate.

The general aspect of the device may further provide a dielectric layer between the control gate and the floating gate.

The general aspect of the device may further provide that the dielectric layer includes a sidewall oxide layer, a high-voltage oxide layer, and a sidewall nitride layer between the sidewall oxide layer and the high-voltage oxide layer, the sidewall oxide layer contacting one side of the floating gate.

The general aspect of the device may further provide that the dielectric layer includes an ONO stack including an oxide layer, a nitride layer, and an oxide layer.

The general aspect of the device may further provide that the dielectric layer includes a high-k oxide stack in which an aluminum oxide layer and a hafnium oxide layer are alternately deposited.

The general aspect of the device may further provide that the high-voltage oxide layer is formed of the same material as the gate insulating layer, and the high-voltage oxide layer has a thickness that is less than the thickness of the gate insulating layer.

The general aspect of the device may further provide a low-doped drain (LDD) spacer on an other side of the floating gate.

The general aspect of the device may further provide a borderless contact (BLC) layer covering the floating gate, the control gate, and the dielectric layer.

The general aspect of the device may further provide that the BLC layer, the high-voltage oxide layer, and the sidewall nitride layer contact one another, the sidewall nitride layer contacts the hard mask, and a side of the high-voltage oxide layer contacts the silicide layer and the control gate.

Other features and aspects may be apparent from the following detailed description, the drawings, and the claims.

BRIEF DESCRIPTION OF THE DRAWINGS

FIG. 5 is a schematic diagram illustrating an example of a method of manufacturing a memory device, according to a general aspect.

Figure 1:
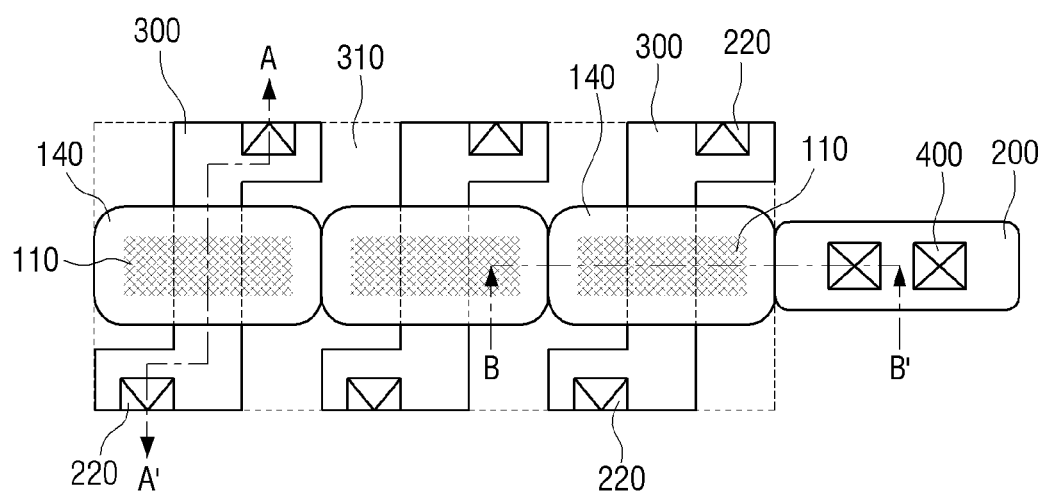
FIG. 1 is a plan view illustrating an example of a memory device region according to a general aspect.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not necessarily be to scale, and, in some instances, proportions may have been exaggerated in order to clearly illustrate features of the examples.

FIGS. 1 to 4A are diagrams illustrating examples of a memory device region according to a general aspects.

Figure 2A:
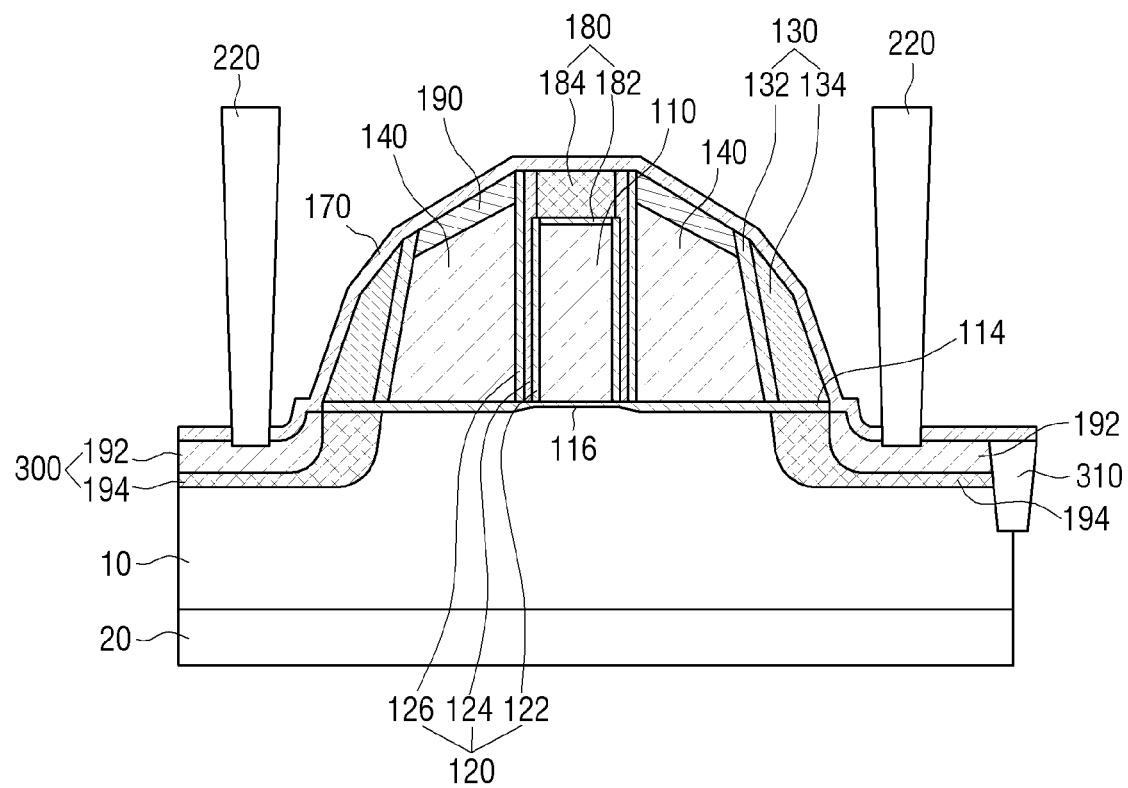
FIG. 2A is a cross-sectional view taken along line A-A' of FIG. 1 according to a general aspect.
Figure 2B:
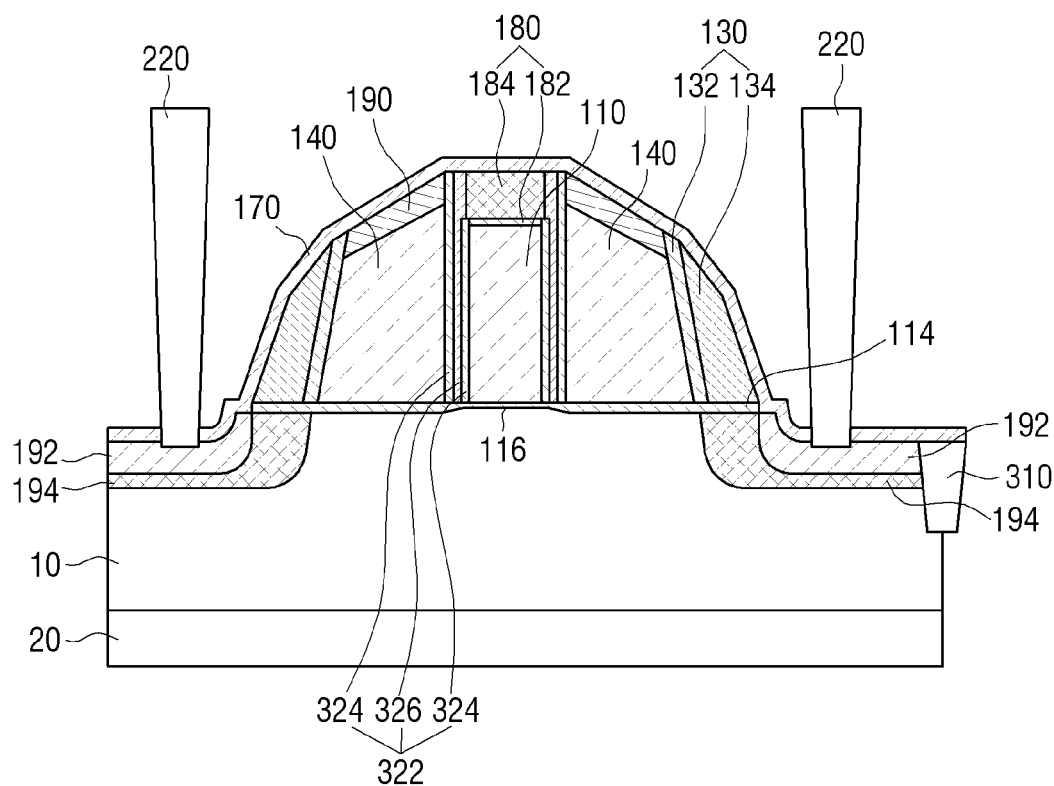
FIG. 2B is a cross-sectional view taken along line A-A' of FIG. 1 according to another general aspect.
Figure 2C:
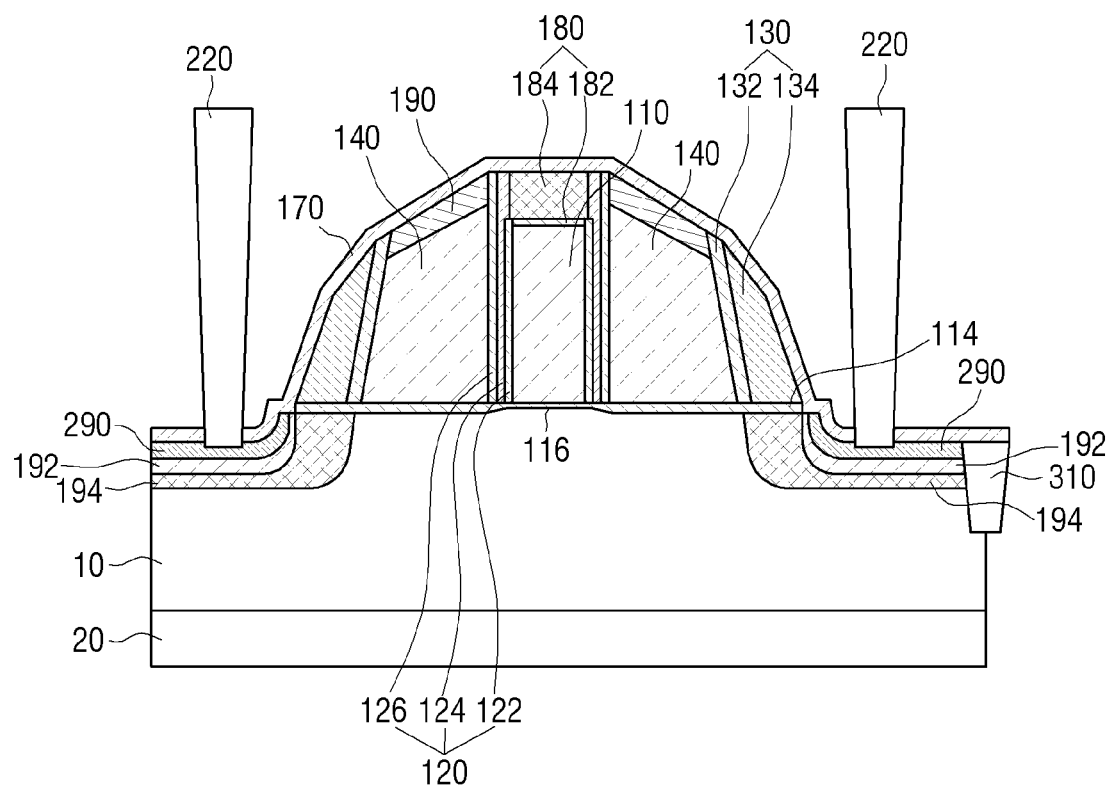
FIG. 2C is a cross-sectional view taken along line A-A' of FIG. 1 according to yet another general aspect.
Figure 3:
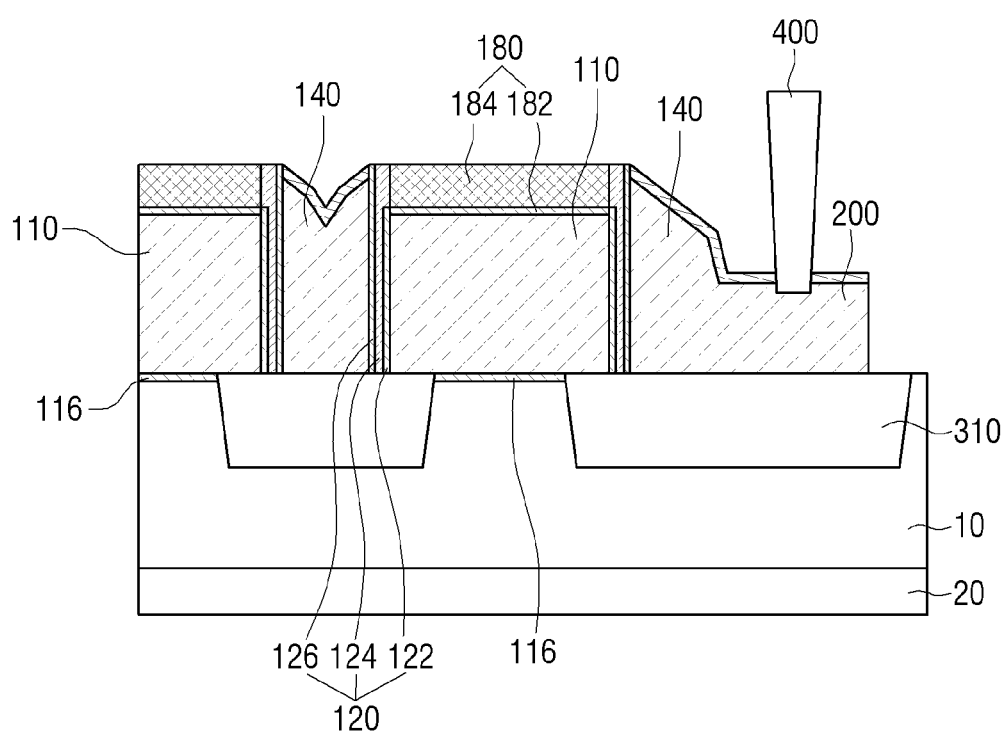
FIG. 3 is a cross-sectional view taken along line B-B' of FIG. 1.

Referring to FIGS. 1 to 4A, the memory device region includes a plurality of floating gates 110, each of which are formed on a substrate, a plurality of control gates 140, each of which surround the floating gates 110, and a plurality of active regions 300, each of which are disposed on one side of the floating gates 110 and the control gates 140. The active regions 300 may be active areas in which source and drain regions 192 and 194 are formed. Isolation regions 310 are provided between the active regions 300. Accordingly, the active regions 300 and the isolation regions 310 coexist below the floating gates 110 and the control gates 140 (FIG. 3). The control gates 140 are not formed on the floating gates 110, but are formed around the floating gates 110 and may take the form of spacers. The control gates 140 may be formed to surround all the sides of the floating gates 110. Accordingly, it may be possible to increase the overlapping area of the control gates 140 and the floating gates 110, reduce the size of cells, increase the coupling ratio, and reduce the driving voltage for each cell. In an example of a method of manufacturing the memory device according to a general aspect illustrated in FIG. 5, the control gates 140 are formed by depositing a conductive layer 150 (FIG. 5(1)) and performing an etch-back on the conductive layer 150 (FIG. 5(2)).

FIG. 2A is a cross-sectional view taken along line A-A' of FIG. 1 according to a general aspect. Referring to FIG. 2A, a deep N well 20 and a P well 10 are formed below a floating gate 110 and a control gate 140. The deep N well 20 is formed below the P well 10 to isolate the P well 10 from a semiconductor substrate and prevent hot carriers from the semiconductor substrate from infiltrating into the P well 10.

(N+)-doped regions 192 and (N−)-doped regions 194 may be formed on either side of the P well 10, thereby forming source/drain (S/D) regions. S/D contacts 220 are connected to the (N+)-doped regions 192. An isolation region 310 is formed on one side of the S/D regions, and may electrically isolate a memory cell.

A gate insulating layer 114 is formed over the P well 10. A tunnel insulating layer 116, which has a thickness that is less than a thickness of the gate insulating layer 114, is formed at the center of the gate insulating layer 114.

The control gate 140 is formed on the gate insulating layer 114, and the floating gate 110 is formed on the tunnel insulating layer 116.

A dielectric layer 120 is formed between the floating gate 110 and the control gate 140. For example, an ONO stack of an oxide layer 122, a nitride layer 124, and an oxide layer 126 is formed as the dielectric layer 120. However, a high-k oxide layer such as a tantalum oxide layer, aluminum oxide ($Al_2O_3$) layer, or the like may be formed as a dielectric layer. By using a high-k oxide layer as a dielectric layer, it is possible to increase capacitance and coupling efficiency.

Further, FIG. 2B is a cross-sectional view taken along line A-A' of FIG. 1 according to another general aspect. Referring to FIG. 2B, a high-k oxide stack 322 in which an aluminum oxide layer 324 and a hafnium oxide ($HfO_2$) layer 326 are alternately deposited may be formed as the dielectric layer 320. By using the high-k oxide stack 322 as the dielectric layer 320, it is also possible to increase capacitance and coupling efficiency.

Referring once again to FIG. 2A, the dielectric layer 120 includes a sidewall oxide layer 122, which contacts the sides of the floating gate 110, a high-voltage oxide layer 126, and the nitride layer 124, which is formed between the sidewall oxide layer 122 and the high-voltage oxide layer 126. The sidewall oxide layer 122 may be formed, after the formation of the floating gate 110, by a thermal oxidation for removing any damage that may be caused by etching in forming the floating gate 110.

The high-voltage oxide layer 126 and the gate insulating layer 114 may be formed at the same time to simplify the manufacturing processes and produce high-quality oxide layers. The high-voltage oxide layer 126 and the gate insulating layer 114 may be formed to constitute a single continuous layer.

The formation of the gate insulating layer 114 and the high-voltage oxide layer 126 will hereinafter be described. A Chemical Vapor Deposition (CVD) (or High-temperature, Low-pressure CVD (HLD)) oxide layer may be deposited to a thickness of 100 Å to 300 Å by using a tetraethoxysilane (TEOS) material and low-pressure CVD (LPCVD). A thermal oxide layer may be formed to a thickness of 50 Å to 150 Å by performing a thermal oxidation on the CVD oxide layer at a temperature of 800° C. to 1000° C. In this example, the gate insulating layer 114 may have a thickness of 200 Å to 400 Å, and may include a stack of the thermal oxide layer and the CVD oxide layer.

During the thermal oxidation at a temperature of 800° C. to 1000° C., the density of the CVD oxide layer may increase so that the CVD oxide layer may be transformed into an oxide layer having the properties of a typical thermal oxide layer. Accordingly, the gate insulating layer 114 may appear to include a single thermal oxide layer that is deposited to a thickness of 200 Å to 400 Å. Since the sidewall nitride layer 124 is hardly oxidized by thermal oxidation, an oxide layer may be formed by using CVD, and thermal oxidation may be performed on the oxide layer, thereby forming the gate insulating layer 114. Since the high-voltage oxide layer 126 is grown on the sidewall nitride layers 124, the high-voltage oxide layer 126 may have a thickness that is slightly less than a thickness of the gate insulating layer 114, which is directly grown on a semiconductor substrate that is formed of silicon.

The tunnel insulating layer 116, unlike the gate insulating layer 114, may be formed through thermal oxidation only. In this example, the tunnel insulating layer 116 may have improved properties, such as weak dangling bonding with respect to a semiconductor substrate, as compared to a CVD oxide layer. Even though the gate insulating layer 114 is formed based on a CVD oxide layer, the gate insulating layer 114 may also be subject to thermal oxidation, which is performed at a temperature of 800° C. to 1000° C., and may have properties that are similar to those provided by the tunnel insulating layer 116. The tunnel insulating layer 116 has a thickness that is less than a thickness of the gate insulating layer 114, and may thus transfer electric charges therethrough.

The floating gate 140 has an inner side placed in contact with the dielectric layer 120, and a low-doped drain (LDD) spacer 130 is formed along the outer side of the floating gate 140.

The LDD spacer 130 includes a LDD oxide layer 132 and a LDD nitride layer 134. Since ion implantation for forming the (N+)-doped regions 192 is performed after the formation of the LDD spacer 130, the (N+)-doped regions 192 may be formed to be aligned with the LDD spacer 130.

A hard mask 180 is formed on the floating gate 110. The hard mask 180 includes a hard mask oxide layer 182 and a hard mask nitride layer 184. The hard mask oxide layer 182 may be an oxide layer obtained by CVD (or HLD).

A silicide layer 190 is formed on the control gate 140. The silicide layer 190 may reduce the resistance of the control gate 140. In addition, referring to FIG. 2C, a silicide layer 290 is formed over the (N+)-doped regions 192 (i.e., the S/D regions) to reduce the contact resistance between the S/D regions and a contact plug 400. However, no silicide layer is formed on the floating gate 110 that is surrounded by the hard mask 180 and the dielectric layer 120.

The floating gate 110, the control gate 140, the LDD spacer 130, the S/D regions, and the silicide layer 190 are covered with a borderless contact (BLC) layer 170. The BLC layer 170 may be provided to address the problems associated with line width narrowing. The BLC layer 170 may be formed as a SiON or SiN layer having an etching selectivity with respect to the isolation 310, and may have a thickness of 100 Å to 500 Å.

Referring to FIG. 2A, the BLC layer 170 is formed to contact the high-voltage oxide layer 126 and the sidewall nitride layer 124, and the sidewall nitride layer 124 is formed to contact the hard mask 180 as well as the BLC layer 170. In this manner, it is possible to fabricate an Electrically Erasable Programmable Read-Only Memory (EEPROM) device having a compact structure with no structural defects. On the other hand, the high-voltage oxide layer 126 is formed to contact the BLC layer 170, the silicide layer 190, and the control gate 140, whereas the sidewall oxide layer 122 does not contact the BLC layer 170. In this manner, it is possible to properly isolate the floating gate 110 and the control gate 140 from each other.

The floating gate 110 may be formed to have a length of 0.2 μm and a height of 0.35 μm. The control gate 140 may have a length of 0.2 μm. The dielectric layer 120 may have a height of 0.45 μm.

FIG. 3 is a cross-sectional view taken along line B-B' of FIG. 1. Referring to FIG. 3, a P well 10 is formed on an N well 20, and isolations 310 that electrically isolate one memory cell from another memory cell are formed in the P well 10. A tunnel insulating layer 116 is formed between the isolations 310.

Floating gates 110 are formed on the tunnel insulating layer 116. Hard masks 180 are formed on the floating gates 110, respectively. Control gates 140 are formed to surround the floating gates 110 with a dielectric layer 120 interposed therebetween.

A poly pad 200 is formed on one side of the control gates 140 in one body with the control gates 140. The isolation regions 310, which are formed of a field oxide, are at the bottom of a control gate 140 that is overlapped with a poly pad 200. Subsequently, a contact plug 400 is formed to contact the poly pad 200. The contact plug 400 may contact the isolation regions 310, as it is over-etched, causing penetration of the poly pad 200. If there is an active region, a voltage may be applied to the active region, causing device malfunction. A poly pad 200 is extended from the control gates 140 in one body with the control gates 140. The poly pad 200 has the same material of the control gate 140, because both the poly pad 200 and the control gate 140 are formed by a single step process. The contact plug 400 is connected to the poly pad 200 so that a bias may be applied to the control gates 140.

The poly pad 200 has a height that is less than a height of the floating gates 110 to optimize capacitance efficiency. For example, the poly pad 200 may have a height of 150 nm to 250 nm, and the floating gate 110 may have a height of 300 nm to 400 nm.

Figure 4A:
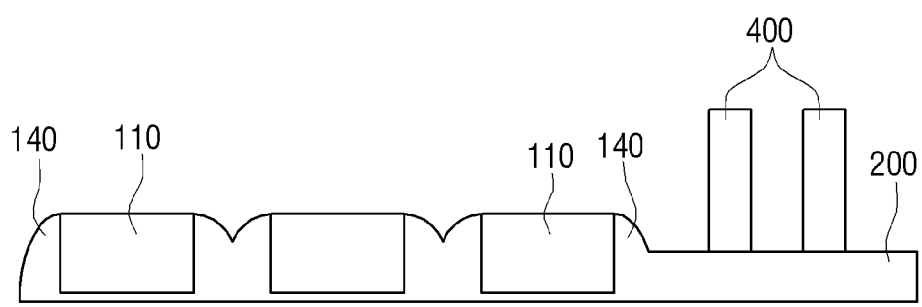
FIG. 4A is a cross-sectional view illustrating an example of the memory device region according to a general aspect.

FIG. 4A is a cross-sectional view illustrating an example of the memory device region according to a general aspect. Referring to FIG. 4A, a poly pad 200 is formed on one side of a plurality of control gates 140, and may be connected to a plurality of floating gates 110 and the control gates 140.

A plurality of contact plugs 400 is provided such that the efficiency of applying a bias may be improved. The contact plugs 400 are connected to the poly pad 200.

Memory device regions according to other aspects will hereinafter be described with reference to FIGS. 4B to 4F, focusing mainly on differences with the general aspect illustrated in FIGS. 1 to 3.

Figure 4B:
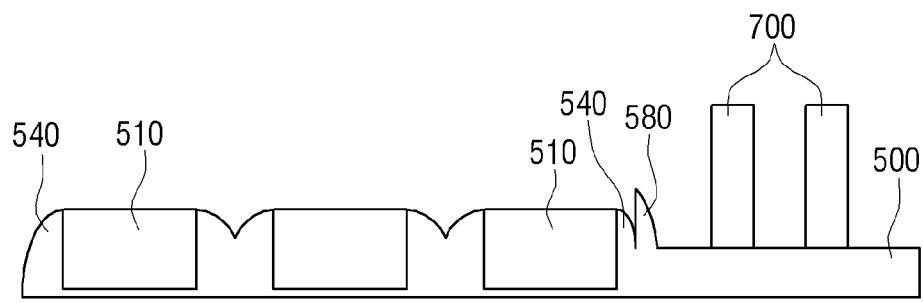
FIG. 4B is a cross-sectional view illustrating an example of a memory device region according to another general aspect.

Referring to FIG. 4B, a memory device region according to another aspect includes a plurality of floating gates 510 and a plurality of control gates 540 that surround the floating gates 510. A poly pad 500 is formed on one side of the control gates 540. A polysilicon peak 580 is formed between the control gates 540 and the poly pad 500. A plurality of contact plugs 700 may be connected to the poly pad 500. A distance between the control gates 540 and the contact plugs 700 may be less than a distance between the control gates 140 and the contact plugs 400 illustrated in FIG. 4A.

Figure 4C:
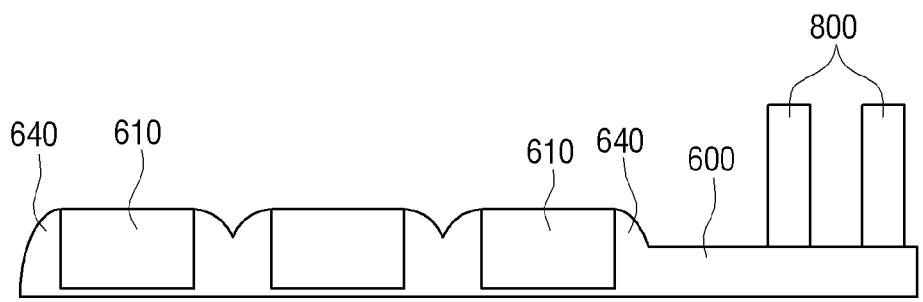
FIG. 4C is a cross-sectional view illustrating an example of a memory device region according to yet another general aspect.

Referring to FIG. 4C, a memory device region according to yet another aspect includes a plurality of floating gates 610 and a plurality of control gates 640 that surround the floating gates 610. A poly pad 600 is formed on one side of the control gates 640. A plurality of contact plugs 800 may be connected to the poly pad 600. The distance between the control gates 640 and the contact plugs 800 may be greater than the distance between the control gates 140 and the contact plugs 400 illustrated in FIG. 4A.

Figure 4D:
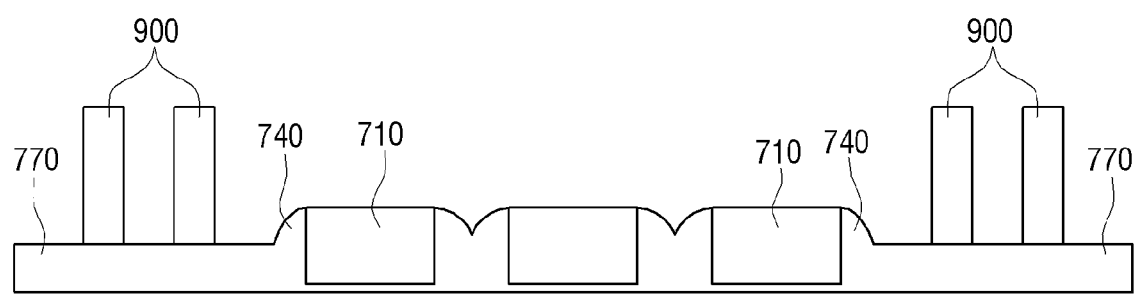
FIG. 4D is a cross-sectional view illustrating an example of a memory device region according to still another general aspect.

Referring to FIG. 4D, a memory device region according to still another aspect includes a plurality of floating gates 710 and a plurality of control gates 740 that surround the floating gates 710. Two poly pads 770 may be formed on either side of the control gates 740. A plurality of contact plugs 900 may be connected to each of the poly pads 770.

Figure 4E:
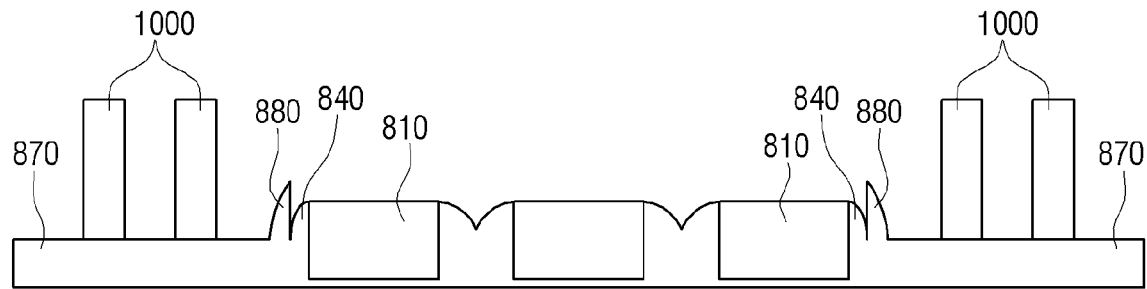
FIG. 4E is a cross-sectional view illustrating an example of a memory device region according to an additional general aspect.

Referring to FIG. 4E, a memory device region according to an additional aspect includes a plurality of floating gates 810 and a plurality of control gates 840 that surround the floating gates 810. Two poly pads 870 may be formed on either side of the control gates 840. In this example, polysilicon peaks 880 are formed between the control gates 840 and the poly pads 870, and a plurality of contact plugs 1000 may be connected to each of the poly pads 870. The distance between the control gates 840 and the contact plugs 1000 may be less than the distance between the control gates 740 and the contact plugs 900 illustrated in FIG. 4D.

Figure 4F:
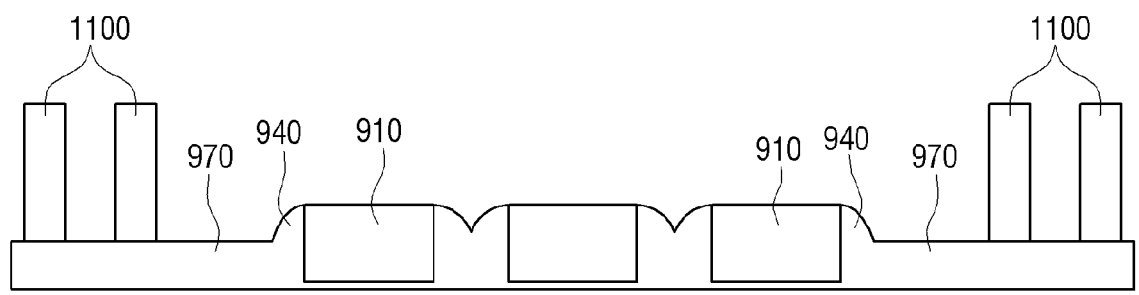
FIG. 4F is a cross-sectional view illustrating an example of a memory device region according to a further general aspect.

Referring to FIG. 4F, a memory device region according to a further aspect includes a plurality of floating gates 910 and a plurality of control gates 940 that surround the floating gates 910. Two poly pads 970 may be formed on either side of the control gates 940. In this example, a plurality of contact plugs 1100 may be connected to each of the poly pads 970. The distance between the control gates 840 and the contact plugs 1000 may be greater than the distance between the control gates 740 and the contact plugs 900 illustrated in FIG. 4D.

FIG. 5 is a diagram illustrating an example of a method of manufacturing a memory device, according to a general aspect. For example, in FIG. 5(1), the isolation regions 310 are formed to distinguish the active region, a plurality of floating gates 110 may be formed on a substrate, and a dielectric layer 120 and hard mask 180 may be formed on the plurality of floating gates 110 to conform to the shapes of the floating gates 110.

Referring to FIG. 5(2), a conductive layer 150 for forming a plurality of control gates 140 is deposited. The conductive layer 150 may be formed on the substrate to cover the floating gates 110, the dielectric layer 120, and the hard mask 180.

Referring to FIG. 5(3), a photoresist pattern 160 is formed. The conductive layer 150 includes a first conductive layer 152, which may be formed to cover the floating gates 110, the dielectric layer 120, and the hard mask 180, and a second conductive layer 154, which is formed on one side of the first conductive layer 152 where a poly pad 200 is to be formed. The second conductive layer 154 is formed to have a height that is less than a height of the first conductive layer 152. The photoresist pattern 160 is formed on the second conductive layer 154 to contact an inclined portion of the first conductive layer 152 at the interface between the first and second conductive layers 152 and 154.

In FIG. 5(4), a plurality of control gates 140 may be formed through an etch-back, and in FIG. 5(5), the poly pad 200 may be formed by removing the photoresist pattern 160.

For example, the etch-back may be a poly etch-back. The conductive layer 150 may be subject to the etch-back until the dielectric layer 120 on the floating gates 110 is exposed. The second conductive layer 154 may be prevented from being etched away due to the presence of the photoresist pattern 160, whereas the first conductive layer 152 may be partially etched way so that the control gates 140 may be formed as a spacer 130 feature. An additional etch may be performed after the etch-back. Because of the additional etch, portions of the dielectric layer 120 on hard masks 180 may all be removed so that the hard masks 180 may be exposed. The height of the control gates 140 may be less than or equal to the height of the floating gates 110 and the hard masks 180 combined, but greater than the height of the floating gates 110, so that the overlapping area of the control gates 140 and the floating gates 110 may be increased, and a coupling effect may be maximized. If the height of the control gates 140 is less than the height of the floating gates 110, the overlapping area of the control gates 140 and the floating gates 110 and the coupling effect may decrease by as much, and a driving voltage for the control gates 140 may increase.

After the etch-back, the photoresist pattern 160 may be removed from the top of the second conductive layer 154. As a result, the poly pad 200, which is connected to the control gates 140, may be formed. The end of the poly pad 200 may coincide with the end of the inclined portion of the first conductive layer 152. The location of the poly pad 200 with respect to the control gates 140 may vary depending on the margin for forming the photoresist pattern 160. That is, the end of the poly pad 200 may not necessarily coincide with the end of the inclined portion of the first conductive layer 152, but may be located near the end of the inclined portion of the first conductive layer 152.

In FIG. 5(6), a plurality of contact plugs 400 may be connected to the poly pad 200 so that a bias may be applied to the control gates 140 via the contact plugs 400. The contact plugs 400 are a predetermined distance apart from each other so that the efficiency of the application of a bias may increase. The second conductive layer 154 and the contact plugs 400 may be provided on both sides of the first conductive layer 152.

Figure 6:
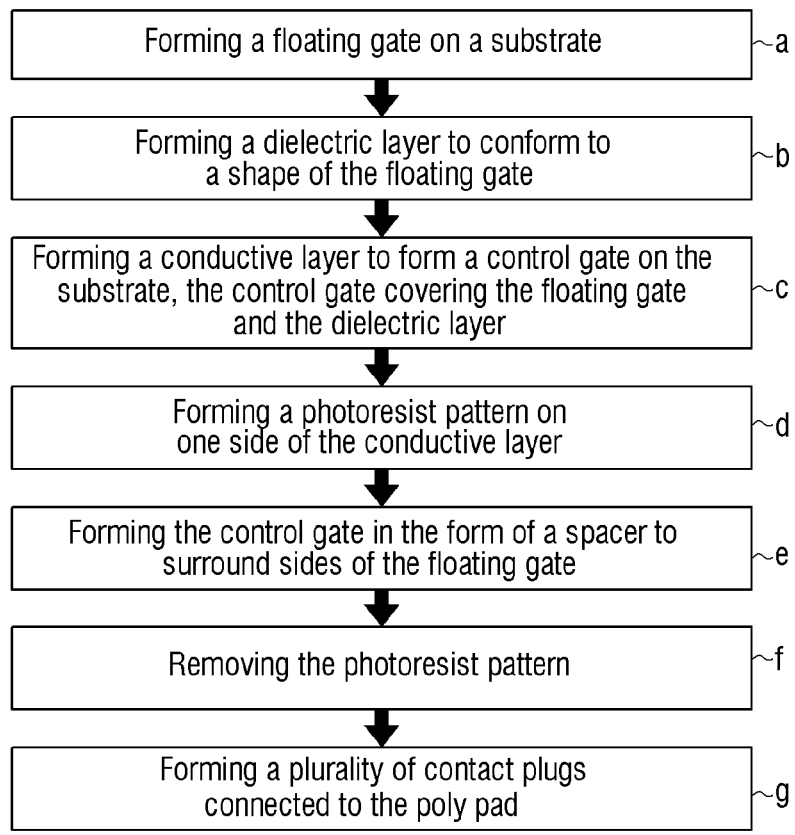
FIG. 6 is a flow chart illustrating an example of a method of manufacturing a memory device, according to a general aspect.

FIG. 6 is a flow chart illustrating an example of a method of manufacturing a memory device, according to a general aspect. Referring to FIG. 6, the method is performed in an order. First, a floating gate 110 is formed (a) 110 on a substrate. A dielectric layer 120 is formed (b) to conform to a shape of the formed floating gate 110. A conductive layer 150 is formed (c) to form a control gate 140 on the substrate, the control gate 140 covering the formed floating gate 110 and the formed dielectric layer 120. A photoresist pattern 160 is formed (d) on one side of the formed conductive layer 150. The control gate 140 is formed (e) in the form of a spacer to surround sides of the formed floating gate 110. After forming the control gate to surround sides of the formed floating gate 110, the photoresist pattern 160 is removed (f). After the removing of the photoresist, a plurality of contact plugs 400 is formed (g) connected to a poly pad 200.

Methods of manufacturing a memory device, according to other aspects, will hereinafter be described with reference to FIGS. 7 and 8, respectively, focusing mainly on the differences with the method of manufacturing a memory device, according to the general aspect.

Figure 7:
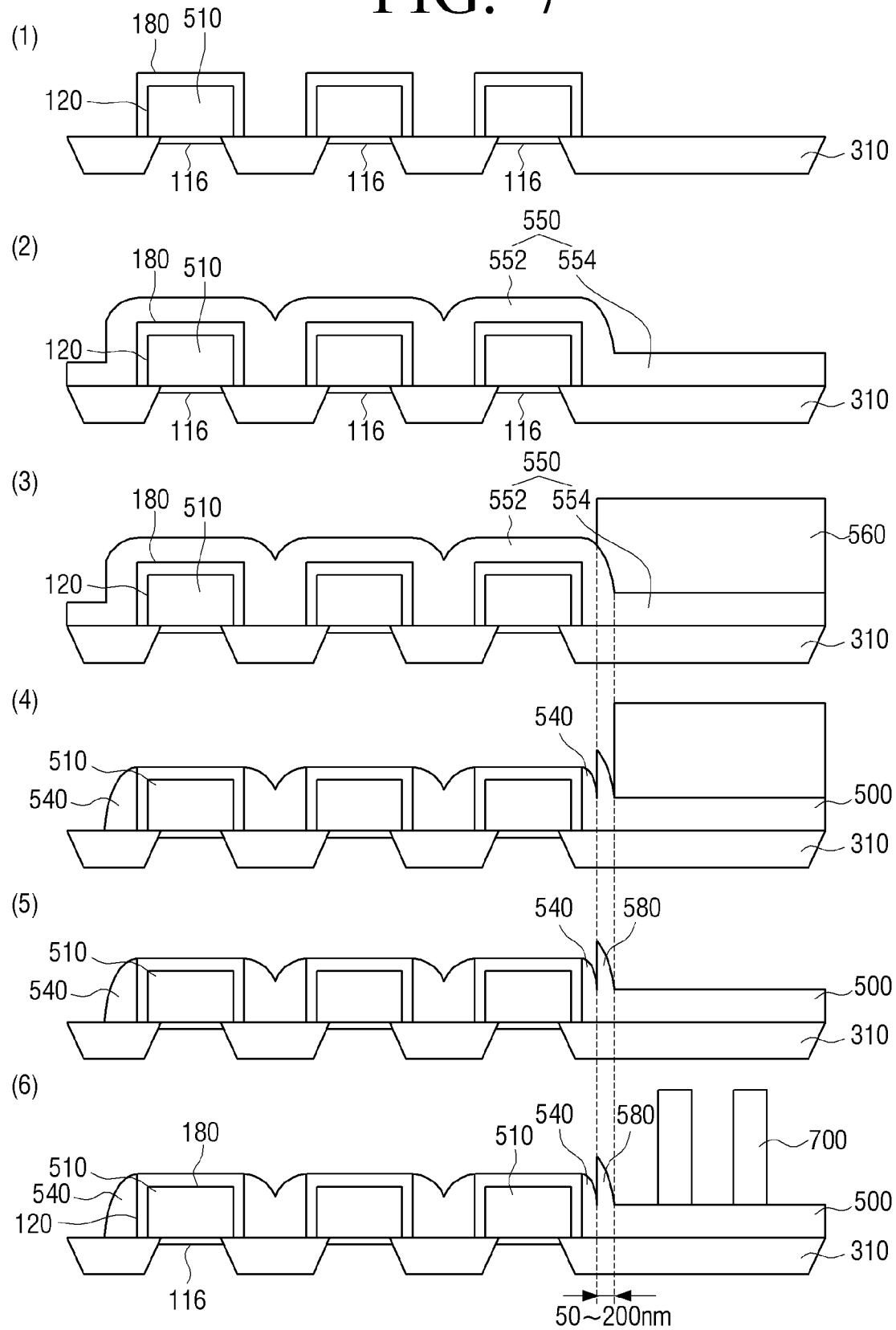
FIG. 7 is a schematic diagram illustrating an example of a method of manufacturing a memory device, according to another general aspect.

For example, referring to FIGS. 7(1) to 7(3), a conductive layer 550 to form a plurality of control gates 540 may be deposited, and a photoresist pattern 560 is formed. The conductive layer 550 includes a first conductive layer 552 and a second conductive layer 554. The photoresist pattern 560 is formed on the second conductive layer 554 to partially cover the first conductive layer 552. The distance between the photoresist pattern 560 and a plurality of floating gates 510 is in a range of 50 nm to 200 nm.

If the photoresist pattern 560 is less than 50 nm apart from the floating gates 110, the first conductive layer 552 may not be properly etched during an etch-back for forming a plurality of control gates 540 due to the photoresist pattern 560, and thus, a plurality of control gates 540 may not be properly formed. Alternatively, if the photoresist pattern 560 is greater than 200 nm apart from the floating gates 110, a poly pad 500 may be etched, and thus, the gate insulating layer 114 on a substrate may be exposed. In addition, since the control gates 540 and the poly pad 500 are relatively distant, a bias may not be properly applied to the control gates 540. Therefore, the photoresist pattern 560 may be formed such that the distance between the photoresist pattern 560 and the floating gates 510 may be 50 nm to 150 nm.

In FIG. 7(4), the control gates 540 may be formed by an etch-back, and in FIG. 7(5), the poly pad 500 may be formed by removing the photoresist pattern 560. During the etch-back, not only the second conductive layer 554 but also part of the first conductive layer 552 may be prevented from being etched away due to the photoresist pattern 560. Because of the removal of the photoresist pattern 560, a non-etched portion of the first conductive layer 552 is formed as the polysilicon peak 580 along with the poly pad 500. The polysilicon peak 580 may be formed over an inclined portion of one of the control gates 540 that is closest to the poly pad 500.

In FIG. 7(6), a plurality of contact plugs 700 may be connected to the poly pad 500 so that a bias may be applied to the control gates 540 via the contact plugs 700. The polysilicon peak 580 simply accounts for part of the shape of the exterior of the poly pad 500, and does not affect the application of a bias to the control gates 540.

In the general aspect illustrated in FIG. 7, the photoresist pattern 560 is formed not only on the second conductive layer 554 but also on part of the first conductive layer 552. The efficiency of the fabrication of the photoresist pattern 560 may be greater than the efficiency of the fabrication of the photoresist pattern 160 illustrated in FIG. 5, which is formed to be aligned with the interface between the first and second conductive layers 152 and 154. The second conductive layer 554 and the contact plugs 700 may be provided on both sides of the first conductive layer 552.

Figure 8:
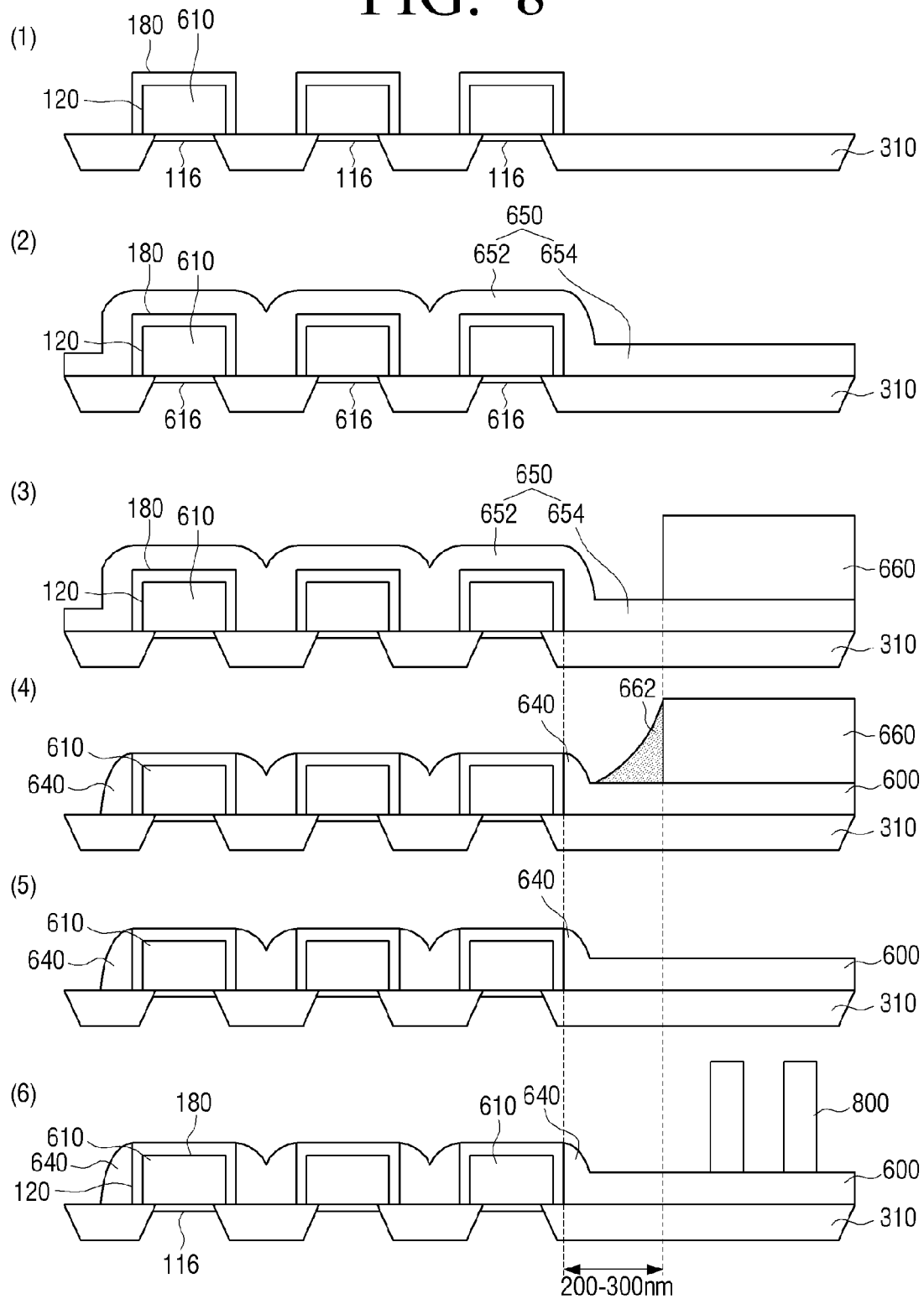
FIG. 8 is a schematic diagram illustrating an example of a method of manufacturing a memory device, according to yet another general aspect.

Referring to FIGS. 8(1) to 8(3), a conductive layer 650 for forming a plurality of control gates 640 may be deposited, and a photoresist pattern 660 is formed. The conductive layer 650 includes a first conductive layer 652 and a second conductive layer 654. The photoresist pattern 660 is formed on the second conductive layer 654 a predetermined distance apart from the first conductive layer 652. The distance between the photoresist pattern 660 and a plurality of floating gates 610 is in a range of 200 nm to 300 nm.

In FIG. 8(4), a plurality of control gates 640 may be formed by an etch-back, and in FIG. 8(5), a poly pad 600 may be formed by removing the photoresist pattern 660. During the etch-back, a polymer 662 may be formed between the first conductive layer 652 and the photoresist pattern 660, filling the gap between the first conductive layer 652 and the photoresist pattern 660. Accordingly, not only a portion of the second conductive layer 654 that is covered by the photoresist pattern 660 but also a portion of the second conductive layer 654 that is not covered by the photoresist pattern 660 may be prevented from being etched away during the etch-back. If a polymer 662 does not accumulate on the portion of the second conductive layer 654 that is not covered by the photoresist pattern 660, the portion of the second conductive layer 654 that is not covered by the photoresist pattern 660 may be etched away during the etch-back, and thus, the poly pad 600 may not be able to be properly connected to the first conductive layer 652. Proper etching conditions may need to be set to generate the polymer 662. However, the general aspect illustrated in FIG. 8 may be less suitable than the general aspects illustrated in of FIGS. 5 and 7 being under the etching conditions that do not lead to the formation of the polymer 662.

In FIG. 8(5), when the etch-back is complete, the photoresist 660 and the polymer 662 may be removed.

In FIG. 8(6), a plurality of contact plugs 800 may be connected to the poly pad 600. Since, due to the presence of the polymer 662, no short occurs in the portion of the second conductive layer 654 that is not covered by the photoresist pattern 660 during the etch-back, a bias may be effectively applied to the control gates 640 via the contact plugs 800.

In the general aspect illustrated in FIG. 8, the photoresist pattern 660 may be formed not only on the second conductive layer 654 but also on part of the first conductive layer 652 as long as the distance between the first conductive layer 652 and the photoresist pattern 660 is maintained to be less than 300 nm. The efficiency of the fabrication of the photoresist pattern 660 may be greater than the efficiency of the fabrication of the photoresist pattern 160 illustrated in FIG. 5, which is formed to be aligned with the interface between the first and second conductive layers 152 and 154. The second conductive layer 654 and the contact plugs 800 may be provided on both sides of the first conductive layer 652.

According to the teachings above, it is possible to form a poly pad, to which a plurality of contact plugs may be connected, during the formation of a plurality of control gates and thus to effectively apply a bias to the control gates via the poly pad.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A method of manufacturing a nonvolatile memory device, the method comprising:
   forming a floating gate on a substrate;
   forming a dielectric layer to conform to a shape of the floating gate;
   forming a conductive layer to form a control gate on the substrate, the control gate covering the floating gate and the dielectric layer;
   forming a photoresist pattern on one side of the conductive layer;
   forming the control gate in the form of a spacer to surround sides of the floating gate, the forming of the control gate comprising performing an etch-back on the conductive layer until a portion of the dielectric layer on the floating gate is exposed; and
   forming a poly pad, to which a plurality of contact plugs are connected, on one side of the control gate, the forming of the poly pad comprising removing the photoresist pattern.

2. The method of claim 1, wherein the control gate and the poly pad are connected to each other.

3. The method of claim 1, wherein the poly pad is located at an end of an inclined portion of the control gate.

4. The method of claim 1, wherein the poly pad includes a polysilicon peak that is formed over an inclined portion of the control gate.

5. A nonvolatile memory device, comprising:
   a floating gate on a substrate;
   a control gate having the form of a spacer, the control gate surrounding sides of the floating gate; and
   a poly pad on one side of the control gate, a plurality of contact plugs being connected to the poly pad.

6. The nonvolatile memory device of claim 5, further comprising:
   a polysilicon peak between the control gate and the poly pad.

7. The nonvolatile memory device of claim 5, wherein the control gate is connected to the floating gate and surrounds the floating gate.

8. The nonvolatile memory device of claim 5, further comprising:
   a silicide layer on the control gate, the silicide layer being configured to reduce a resistance of the control gate.

9. The nonvolatile memory device of claim 8, further comprising:
   a gate insulating layer on the substrate, the control gate being on the gate insulating layer.

10. The nonvolatile memory device of claim 9, further comprising:
    a tunnel insulating layer at a center of the gate insulating layer, the tunnel insulation layer having a thickness that is less than a thickness of the gate insulating layer.

11. The nonvolatile memory device of claim 10, further comprising:
    a hard mask on the floating gate.

12. The nonvolatile memory device of claim 11, wherein a height of the control gate is:
    less than or equal to a height of the hard mask and the floating gate combined; and greater than a height of the floating gate.

13. The nonvolatile memory device of claim 11, further comprising:
    a dielectric layer between the control gate and the floating gate.

14. The nonvolatile memory device of claim 13, wherein the dielectric layer comprises:
    a sidewall oxide layer contacting one side of the floating gate;
    a high-voltage oxide layer; and
    a sidewall nitride layer between the sidewall oxide layer and the high-voltage oxide layer.

15. The nonvolatile memory device of claim 13, wherein the dielectric layer comprises an ONO stack including an oxide layer, a nitride layer, and an oxide layer.

16. The nonvolatile memory device of claim 13, wherein the dielectric layer comprises a high-k oxide stack in which an aluminum oxide layer and a hafnium oxide layer are alternately deposited.

17. The nonvolatile memory device of claim 14, wherein the high-voltage oxide layer:
    is formed of the same material as the gate insulating layer; and
    has a thickness that is less than the thickness of the gate insulating layer.

18. The nonvolatile memory device of claim 14, further comprising:
    a low-doped drain (LDD) spacer on an other side of the floating gate.

19. The nonvolatile memory device of claim 14, further comprising:
    a borderless contact (BLC) layer covering the floating gate, the control gate, and the dielectric layer.

20. The nonvolatile memory device of claim 19, wherein:
    the BLC layer, the high-voltage oxide layer, and the sidewall nitride layer contact one another;
    the sidewall nitride layer contacts the hard mask; and
    a side of the high-voltage oxide layer contacts the silicide layer and the control gate.

21. The nonvolatile memory device of claim 5, further comprising:
    a hard mask disposed above the floating gate;
    a spacer surrounding sides of the control gate; and
    a silicide layer disposed above the control gate between the hard mask and the spacer.

22. A nonvolatile memory device, comprising:
    a plurality of floating gates on a substrate;
    a plurality of control gates having the form of a spacer, each of the plurality of control gates surrounding sides of a corresponding floating gate of the plurality of floating gates; and
    a poly pad that extends from one side of the plurality of control gates, a plurality of contact plugs being connected to the poly pad.

23. The nonvolatile memory device of claim 21, further comprising:
    a plurality of silicide layers, each silicide layer disposed above a control gate of the plurality of control gates, the plurality of silicide layers being configured to reduce a resistance of the plurality of control gates.

* * * * *